United States Patent [19]

Ulmer

[11] Patent Number: 4,612,497
[45] Date of Patent: Sep. 16, 1986

[54] MOS CURRENT LIMITING OUTPUT CIRCUIT

[75] Inventor: Richard W. Ulmer, Austin, Tex.

[73] Assignee: Motorola, Inc., Schaumburg, Ill.

[21] Appl. No.: 776,188

[22] Filed: Sep. 13, 1985

[51] Int. Cl.⁴ .............................................. H03K 5/08
[52] U.S. Cl. .................................... 323/315; 323/908; 307/568; 361/58
[58] Field of Search ...................... 323/312, 315, 908; 307/544, 548, 550, 568; 361/18, 58, 101

[56] References Cited

U.S. PATENT DOCUMENTS

| | | | |
|---|---|---|---|
| 3,275,911 | 9/1966 | Onodera | 307/568 X |
| 3,369,129 | 2/1968 | Wolterman | 307/568 |
| 3,521,087 | 7/1970 | Lombardi | 361/91 X |
| 4,004,164 | 1/1977 | Cranford, Jr. et al. | 323/315 X |
| 4,078,200 | 3/1978 | Ritchie et al. | 307/544 X |
| 4,399,374 | 8/1983 | Boeke | 323/315 X |

Primary Examiner—Peter S. Wong
Attorney, Agent, or Firm—Anthony J. Sarli, Jr.; Jeffrey Van Myers; Robert L. King

[57] ABSTRACT

An MOS current limit circuit which provides current limiting protection is provided. A driver transistor of a conventional output stage is coupled to a current limiting transistor which is one transistor of a current mirror. The current limiting transistor of the current mirror has the $V_{GS}$ thereof accurately biased to insure a precise current limit value. When the current limiting transistor is not performing a current limiting function, the current limiting transistor is made conductive and further provides high voltage protection to the driver transistor when the driver transistor is nonconductive.

7 Claims, 3 Drawing Figures

MOS CURRENT LIMITING OUTPUT CIRCUIT

TECHNICAL FIELD

This invention relates generally to circuits requiring high voltage protection, and more particularly, to telecommunication circuits requiring a current limited output.

BACKGROUND ART

A common technique for providing current limiting protection to an output drive transistor is to use a resistor selectively series coupled with the drive transistor to limit output current to a predetermined value. Current limiting resistors must be selectively switched into an output circuit to avoid constantly interfering with the output current. Therefore, a comparator circuit which senses the output current and compares the sensed current with a reference current to control the switching of the resistor is typically used. However, comparators commonly have too much voltage gain associated therewith and tend to cause an oscillating output. Numerous other bipolar circuits also utilize resistors and base-to-emitter voltages to provide current limited outputs. However, in MOS circuits a bipolar transistor can only be fabricated in an emitter follower structure. Therefore, known bipolar current limiting circuits are not adaptable to MOS counterparts. Further, most bipolar current limiting circuits utilize a relatively stable base to emitter voltage, $V_{be}$, reflected across a resistor to obtain a current limiting function. The MOS equivalent of a $V_{be}$ is a gate to source voltage, VGS, which is not as stable in value with respect to process variations. Therefore, the direct MOS equivalent of known bipolar current limiting circuits results in a highly variable current limiting value.

BRIEF DESCRIPTION OF THE INVENTION

Accordingly, an object of the present invention is to provide an improved circuit for providing current limiting protection.

Another object of the present invention is to provide an improved MOS current limiting circuit.

Yet another object of the present invention is to provide an improved current limit circuit having a substantially constant current limiting value.

In carrying out the above and other objects of the present invention, there is provided, in one form, an output current limit circuit for use in a circuit having an output driver transistor which selectively provides an output voltage to an output terminal. The output current limit circuit comprises a current sink which is coupled to a reference voltage terminal and functions to receive a sink current. A current mirror having a diode configured transistor and a mirror transistor is used. The diode configured transistor has the current conducting electrodes thereof coupled between the driver transistor and the current sink transistor and functions to provide the sink current. The mirror transistor has the current electrodes thereof coupled between the driver transistor and the output terminal and functions to limit the output current.

These and other objects, features and advantages will be more clearly understood from the following detailed description taken in conjunction with the accompanying drawings.

DETAILED DESCRIPTION OF THE INVENTION

Figure 1A:
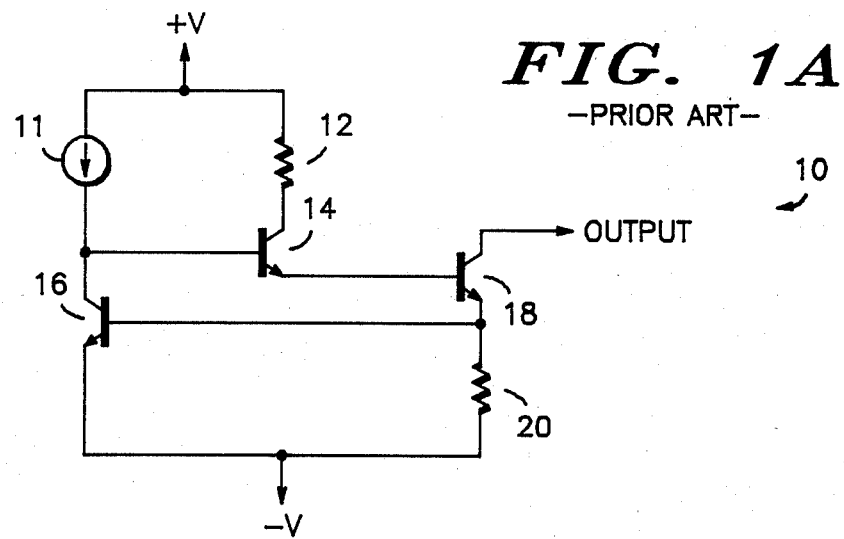
FIGS. 1(a) and 1(b) illustrate in schematic form a bipolar current limit circuit known in the art.
Figure 1B:
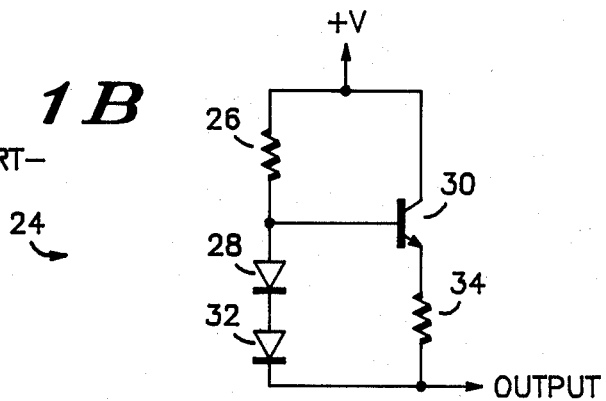

Shown in FIG. 1 (a) is a known bipolar current limit circuit 10 which functions as a current sink to limit a negative transitioning output current to a predetermined amount. A current source 11 has a first terminal connected to a positive supply voltage (+V), and a second terminal. A resistor 12 has a first terminal connected to the positive supply voltage and a second terminal connected to a collector of a bipolar transistor 14. A base of transistor 14 is connected to both the second terminal of current source 11 and a collector of a bipolar transistor 16. An emitter of transistor 16 is connected to a negative power supply voltage (−V). An emitter of transistor 14 is connected to a base of a bipolar transistor 18. An emitter of transistor 18 is connected to both a base of transistor 16 and a first terminal of a resistor 20. A second terminal of resistor 20 is connected to the negative power supply voltage. A collector of transistor 18 provides an output voltage of circuit 10 which is current limited.

In operation, current limit circuit 10 is a current limiting circuit for negative voltage output signals and is therefore a negative current limit circuit. Transistor 18 is configured as a conventional Darlington transistor. Assume initially that current source 11, resistor 12 and transistor 14 are functioning to make transistor 18 conductive to provide a negative output voltage. Transistor 14 couples a positive voltage to the base of transistor 14. The base bias voltage of transistor 18 may readily saturate transistor 18 so that theoretically an infinite amount of current may be provided at the output by transistor 18. However, before this large amount of current is allowed to be provided, transistors 14 and 16 function to remove the base drive voltage from transistor 18. As soon as a voltage potential greater than the base to emitter voltage of transistor 16 exists across resistor 20, transistor 16 becomes conductive which removes the base drive voltage of transistor 14. As a result, transistor 14 makes transistor 18 less conductive. Transistor 18 will thereafter be regulated via the feedback provided by transistors 14 and 16 so that the voltage across resistor 20 is not permitted to be greater than the Vbe of transistor 16. Therefore, the output current is limited to a predetermined value determined primarily by the resistive value of resistor 20 and the $V_{be}$ of transistor 16.

Shown in FIG. 1 (b) is a known bipolar current limit circuit 24 which functions as a current source to limit an output current to a predetermined maximum value. A resistor 26 has a first terminal connected to a positive power supply voltage (+V), and a second terminal connected to both an anode of a diode 28 and to a base of a bipolar transistor 30. A collector of transistor 30 is connected to the positive power supply voltage. A cathode of diode 28 is connected to an anode of a diode 32. A cathode of diode 32 is connected to an output voltage terminal. An emitter of transistor 30 is connected to a first terminal of a resistor 34, and a second terminal of resistor 34 is connected to the output voltage terminal.

In operation, current limit circuit 24 limits output current for positive voltage output signals and is a positive current limit circuit. Assume initially that the output voltage is rising and current is increasing when a direct short circuit to ground potential is applied across the output for whatever reason. By analyzing the loop formed by diodes 28 and 32, transistor 30 and resistor 34, it should be readily apparent that a single diode voltage drop is forced across resistor 34. The base of transistor 30 is clamped at two diode voltage drops above the voltage potential of the output terminal. The base to emitter junction voltage ($V_{be}$) of transistor 30 translates this clamp voltage to only a single diode voltage drop which is clamped across resistor 34. Resistor 26 functions as a bias resistor and is typically large valued. Therefore, resistor 26 is incapable of supplying the entire amount of short circuit current to the output terminal so that circuit 24 is current limited in this respect. Transistor 30 only supplies whatever current to the output which is required to allow only a single $V_{be}$ voltage drop across resistor 34 which completes the limiting of current at the output terminal. As the current flowing through resistor 26 increases, the voltage at the base of transistor 30 reaches a diode threshold voltage drop above the Vbe of transistor 30. At this point, diodes 28 and 32 become conductive and shunt current away from the base of transistor 30. Therefore, transistor 30 is current limited to a value which provides a single $V_{be}$ across resistor 34. Any excess base current coupled to the base of transistor 30 as a result of a large supply voltage is shunted by diodes 28 and 32 to the output without amplification.

Figure 2:
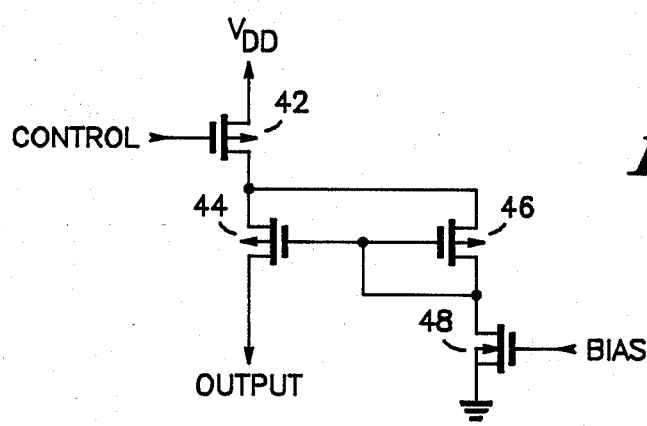
FIG. 2 illustrates in schematic form a current limit circuit in accordance with the present invention.

Shown in FIG. 2 is an MOS current limiting circuit 40 which provides an accurate valued output current. A P-channel transistor 42 has a source connected to a positive power supply voltage, say $V_{DD}$. A base of transistor 42 is coupled to a control voltage, and a drain of transistor 42 is connected to both a source of a P-channel transistor 44 and to a source of a P-channel transistor 46. A gate of transistor 44 is connected to both a gate of transistor 46 and a drain of transistor 46. A drain of transistor 44 provides an output terminal for providing an output voltage with a limited maximum current. The drain of transistor 46 is also connected to a drain of an N-channel transistor 48. A gate of transistor 48 is coupled to a bias voltage, and a source of transistor 48 is coupled to a ground reference voltage potential. It should be understood that although specific N-channel and P-channel MOS devices are shown, current limiting circuit 40 may be implemented by completely reversing the processing techniques (e.g. N-channel to P-channel).

In operation, transistor 42 of current limiting circuit 40 is an output driver transistor which may represent a transistor of an output stage of any of a plurality of various types of circuits. Driver transistor 42 is driven by some type of a control signal which may also be derived from any type of circuitry. Transistor 44 is provided in series with transistor 42 and between transistor 42 and the output terminal to function as both a high voltage protection device for transistor 42 and as a current limiter at the output terminal. As a high voltage protection device, transistor 44 functions to split the full supply voltage $V_{DD}$ potential equally between transistor 42 and transistor 44. Whenever very large power supply voltage potentials are used, a single drive transistor such as transistor 42 may be susceptible to the conventional break down phenomenon. Therefore, transistor 44 raises the breakdown point of transistor 42 by a factor of substantially two. Although in the illustrated form transistors 42 and 44 are P-channel devices, transistors 42 and 44 may be implemented as N-channel devices. To accomplish high voltage protection in an N-channel implementation and a P-well process, transistors 42 and 44 should be fabricated as N-channel devices in two distinct tub regions in a common semiconductor substrate. Transistor 44 is also fabricated as a physically large transistor to pass a large amount of current. Transistor 44 must be biased to analog ground to be conductive and couple the drive voltage of transistor 42 to the output terminal. This function is performed by transistor 48 which is constantly coupled to a bias voltage. Diode configured transistor 46 is also coupled in series with transistor 48 and is made constantly conductive by the anlaog ground bias provided by transistor 48. However, transistors 46 and 48 are fabricated as much smaller transistors physically than transistor 44 and as a result will conduct much less current than transistor 44. Therefore, transistors 46 and 48 function as a fixed current sink at the drain of transistor 42. Because transistor 46 is diode configured, there is only one transistor gate to source voltage ($V_{GS}$) drop between the drain of transistor 42 and the drain of transistor 46. When transistor 42 is not conductive, transistor 46 remains conductive and discharges voltage at the source of transistor 46 stored by parasitic capacitance associated with the source nodal connection. After the voltage at the source of transistor 46 has been discharged to ground via transistors 46 and 48, transistor 46 becomes nonconductive. Therefore, the gate of transistor 44 is clamped at ground potential by transistor 48 which means that the source of transistor 44 is also fixed at approximately one $V_{GS}$ above ground. If the output terminal is forced to a low negative potential by coupled circuitry not shown, the voltage potential across transistors 42 and 44 may become very large. However, if the source of transistor 44 is fixed at a value approximately equal to ground potential, a possible large supply voltage across transistors 42 and 44 is substantially equally divided between each transistor. Therefore, high voltage protection exists for both driver transistor 42 and for transistor 44.

In the illustrated form, transistors 44 and 46 are also a current mirror pair of transistors where transistor 44 functions as a master device and transistor 46 functions as a slave device. Transistors 44 and 46 are ratioed with respect to each other so that transistor 44 conducts much more current than transistor 46. Ratioes in the range of four hundred to one are common to implement a practical current limiting function. However, smaller ratioes such as ten to one may also be used. A predetermined maximum amount of current for transistor 44 to conduct is chosen. Under normal conditions, this amount of current is not conducted by transistor 44 and transistor 44 operates in a nonsaturated region of its voltage/current transfer characteristic curve. At current levels within the nonsaturated region, transistor 44 has a very small $V_{DS}$ voltage drop and appears as a small impedance at the output terminal. As the output current increases and the gate voltage of transistor 44 remains constant, transistor 44 becomes saturated. In the saturated condition of operation, transistor 44 only conducts a predetermined maximum value of current and operates at a relatively flat region of its transfer characteristic curve to acheive the current limiting function desired. During this circuit condition, transistor 44 exhibits a voltage drop across its current conducting electrodes. Because transistor 44 is a relatively strong current source device, transistor 44 also functions as a reliable current limiter in its saturated region of operation. Transistors 46 and 48 function to establish the $V_{GS}$ of transistor 42 on a predetermined curve of the family of transfer curves of transistor 44. The particular curve chosen determines a point of maximum current operation of transistor 44. The precision with which transistor 44 limits current is dependent, in part, upon the preciseness of the ratio of device sizes of transistors 44 and 47. However, this ratio can be set very accurately using known design techniques.

By now it should be apparent that a CMOS current limiter circuit having a non-complex structure and which provides an accurate current limit value over process variations has been provided. The current limit circuit is adaptable for use in any type of output stage of a circuit which needs current limiting protection.

While an embodiment has been described using certain assumed parameters and transistor types, it should be understood that certain obvious modifications to the circuit or the given parameters will become apparent to those skilled in the art, and the scope of the invention should be limited only by the scope of the claims appended hereto.

I claim:

1. In a circuit having an output driver transistor for selectively providing an output voltage to an output terminal, an output current limit circuit for limiting the output current at the output terminal to a predetermined maximum value, comprising:
   current sink means coupled to a reference voltage terminal, for receiving a sink current; and
   current mirror means having a diode configured transistor having the current conducting electrodes thereof coupled between the driver transistor and the current sink means, for providing the sink current, and a mirror transistor having the current electrodes thereof coupled between the driver transistor and the output terminal, for limiting said output current.

2. The output current limit circuit of claim 1 wherein the driver transistor is a P-channel transistor and the current sink means further comprises:
   an N-channel transistor having a drain coupled to the current mirror means, a source coupled to the reference voltage terminal, and a control electrode for receiving a predetermined bias voltage.

3. The output current limit circuit of claim 2 wherein the mirror transistor and diode configured transistor of the current mirror means respectively further comprise:
   a second P-channel transistor having a source coupled to the driver transistor, a gate and a drain coupled to the output terminal; and
   a third P-channel transistor having a source coupled to the source of the second P-channel transistor, and both a gate and a drain connected together and coupled to the gate of the second P-channel transistor.

4. The output current limit circuit of claim 1 wherein control electrode dimensions of the mirror transistor are size ratioed with respect to control electrode dimensions of the diode configured transistor by a ratio of at least ten to one, respectively.

5. An MOS current limiting output circuit, comprising:
   a drive transistor having a first current electrode coupled to a terminal adapted to receive a supply voltage, a control electrode adapted to receive a control voltage, and a second current electrode;
   a second transistor having a first current electrode coupled to the second current electrode of the drive transistor, a control electrode, and a second current electrode for providing a current limited output signal;
   a third transistor having a first current electrode coupled to the second current electrode of the drive transistor, a control electrode coupled to both the control electrode of the second transistor and to a second current electrode of the third transistor; and
   a fourth transistor having a first current electrode coupled to the second current electrode of the third transistor, a control electrode adapted to receive a biasing voltage, and a second current electrode coupled to a reference voltage terminal.

6. The MOS current limiting output circuit of claim 5 wherein said first, second and third transistors are P-channel transistors and said fourth transistor is an N-channel transistor.

7. A method of limiting an output current of a driver transistor, comprising the steps of:
   coupling a current mirror pair of transistor to the driver transistor, said current mirror pair of transistors having a first transistor with a current electrode for providing an output signal and having a second transistor;
   establishing a current thru the second transistor, for sinking current conducted by the second transistor; and
   selectively ratioing control electrode dimensions of the first and second transistors to establish a predetermined bias voltage for the first transistor, thereby limiting current conducted by the first transistor to a predetermined amount.

* * * * *